US010250271B2

(12) United States Patent
Goto

(10) Patent No.: US 10,250,271 B2
(45) Date of Patent: Apr. 2, 2019

(54) QUANTUM COMPUTATION APPARATUS AND QUANTUM COMPUTATION METHOD

(71) Applicant: KABUSHIKI KAISHA TOSHIBA, Tokyo (JP)

(72) Inventor: Hayato Goto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 174 days.

(21) Appl. No.: 15/264,029

(22) Filed: Sep. 13, 2016

(65) Prior Publication Data
US 2017/0104493 A1    Apr. 13, 2017

(30) Foreign Application Priority Data

Oct. 7, 2015 (JP) ................ 2015-199613
Feb. 5, 2016 (JP) ................ 2016-020910

(51) Int. Cl.
| H03L 7/26 | (2006.01) |
| G06N 99/00 | (2019.01) |
| H01L 39/22 | (2006.01) |
| G02F 1/35 | (2006.01) |

(52) U.S. Cl.
CPC ............. *H03L 7/26* (2013.01); *G02F 1/35* (2013.01); *G06N 99/002* (2013.01); *H01L 39/223* (2013.01)

(58) Field of Classification Search
CPC ....... G02F 1/35; G06N 99/002; H01L 39/223; H03L 7/26
USPC .......................... 359/328; 331/2, 46; 977/932
See application file for complete search history.

(56) References Cited

U.S. PATENT DOCUMENTS

| 2006/0145694 A1 | 7/2006 | Oppenlander et al. |
| 2007/0180586 A1 | 8/2007 | Amin |
| 2008/0310000 A1 | 12/2008 | Beausoleil, Jr. et al. |
| 2014/0046626 A1 | 2/2014 | Yamamoto et al. |
| 2016/0162798 A1 | 6/2016 | Marandi et al. |

FOREIGN PATENT DOCUMENTS

| JP | 2008-507739 | 3/2008 |
| JP | 2009-524857 | 7/2009 |
| JP | 4303286 | 7/2009 |

(Continued)

OTHER PUBLICATIONS

Utsunomiya et al.; "Mapping of Ising Models onto Injection-Locked Laser Systems", Optics Express, vol. 19, No. 19, pp. 18091-18108, (2011).

(Continued)

*Primary Examiner* — Arnold Kinkead
(74) *Attorney, Agent, or Firm* — Finnegan, Henderson, Farabow, Garrett & Dunner, L.L.P.

(57) ABSTRACT

According to one embodiment, a quantum computation apparatus includes a plurality of quantum nonlinear oscillators, a controller, and a measuring device. Each of the quantum nonlinear oscillators implements superposition of distinguishable quantum states by bifurcating one quantum state via a quantum adiabatic change controlled by a bifurcation parameter. The quantum nonlinear oscillators couple with each other by nondissipative coupling accompanying no loss. The controller individually controls the bifurcation parameters of the quantum nonlinear oscillators. A measuring device measures outputs from the quantum nonlinear oscillators.

20 Claims, 16 Drawing Sheets

(56) References Cited

FOREIGN PATENT DOCUMENTS

| JP | 2010-109697 | 5/2010 |
|---|---|---|
| JP | 2012-26738 | 2/2011 |
| JP | 5354233 | 11/2013 |
| WO | WO 2015/006494 | 1/2015 |

OTHER PUBLICATIONS

Wang et al.; "Coherent Ising Machine Based on Degenerate Optical Parametric Oscillators", Physical Review, vol. 88, pp. 063853-1 to 063853-9, (2013).

Albert et al.; "Holonomic Quantum Control With Continuous Variable Systems"Supplemental Materials of Physical Review Letters, vol. 116, pp. 1-6, (Apr. 1, 2016).

Albert et al.; "Supplemental Material: Universal Quantum Computing With CAT-Codes", Supplemental Materials of Physical Review Letters, vol. 116, pp. 1-4, (Mar. 30, 2016).

Mirrahimi et al.; "Dynamically Protected CAT-Qubits: A New Paradigm for Universal Quantum Computation", New Journal of Physics, vol. 16, 045014, pp. 1-30, (2014).

Johnson et al.; "Quantum Annealing With Manufactured Spins", Nature, vol. 473, pp. 194-198, (2011).

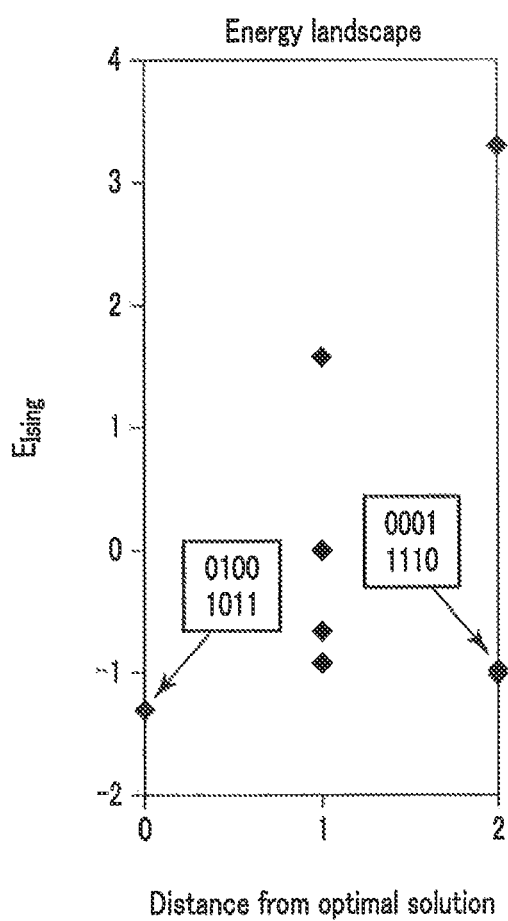
F I G. 6A

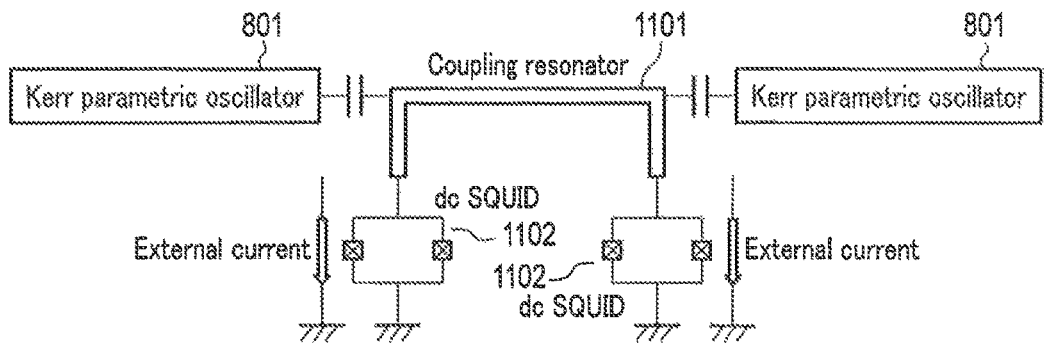
F I G. 11
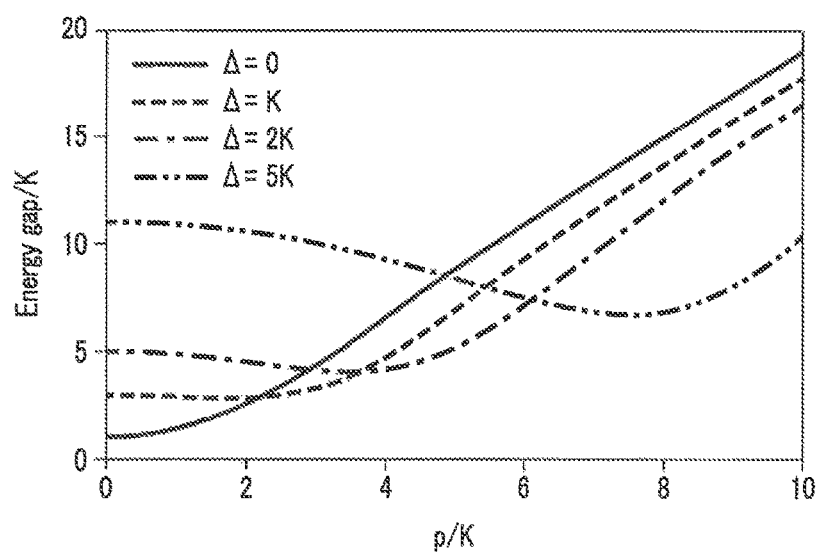
F I G. 12

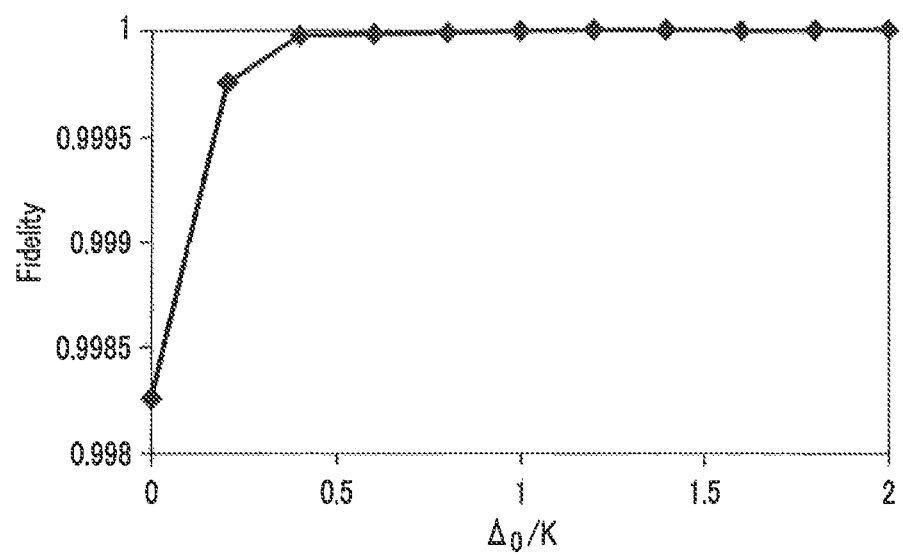
F I G. 18
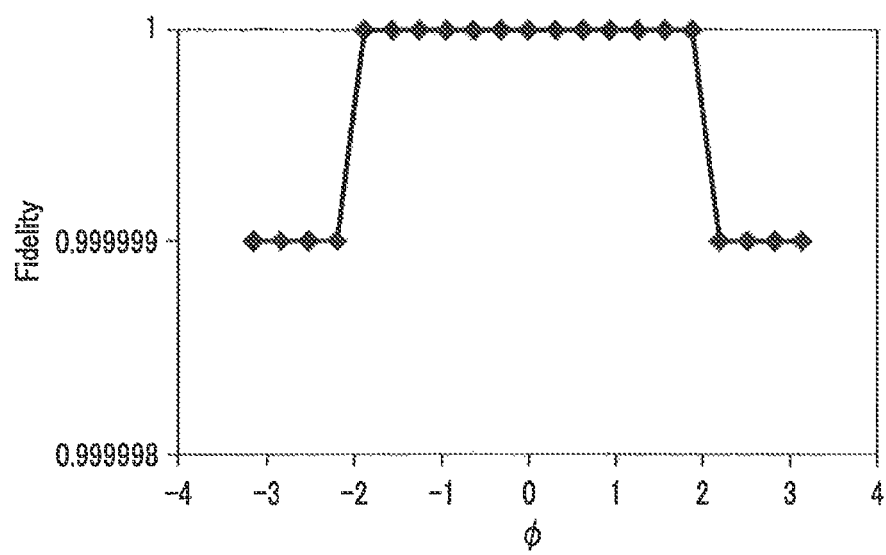
F I G. 19

QUANTUM COMPUTATION APPARATUS AND QUANTUM COMPUTATION METHOD

CROSS-REFERENCE TO RELATED APPLICATIONS

This application is based upon and claims the benefit of priority from Japanese Patent Applications No. 2015-199613, filed Oct. 7, 2015; and No. 2016-020910, filed Feb. 5, 2016, the entire contents of all of which are incorporated herein by reference.

FIELD

Embodiments described herein relate generally to a quantum computation apparatus and quantum computation method, and are used to solve, e.g., a combinatorial optimization problem.

BACKGROUND

A problem of finding a pattern which maximizes or minimizes an amount matching an object (called an objective function) from many combinatorial patterns appears in various scenes of the society. A problem like this is called a combinatorial optimization problem. In this combinatorial optimization problem, the number of solution candidates exponentially increases with respect to the size of the problem. Therefore, it is in many cases difficult to solve combinatorial optimization problems by using present von Neumann computers which perform sequential computation.

A combinatorial optimization problem which maximizes or minimizes a quadratic function including a variable taking a bit value is called a QUBO (Quadratic Unconstrained Binary Optimization) problem.

Many combinatorial optimization problems can be formulated into QUBO problems. It is known to be difficult to solve QUBO problems in many cases. When a bit value is associated with an Ising spin ±1 as a classical spin model, the QUBO problem comes down to a problem (called an Ising problem) for obtaining the minimum energy state (ground state) of an Ising model of statistical mechanics.

Recently, computation apparatuses reportedly capable of rapidly solving this QUBO problem (Ising problem) are attracting attention. For example, a method of finding the ground state of the Ising model by using an oscillation phenomenon of a laser network or parametric oscillator network has been proposed. This method using the oscillation phenomenon is a method which is new in principle and different from simulated annealing (using thermal fluctuation) and quantum annealing (using quantum fluctuation) as earlier QUBO problem solution methods, and the method is presumably hardly trapped to a local optimal solution during computation.

In this method using the oscillation phenomenon, however, a state actually obtained by an oscillation threshold sometimes becomes an approximate solution. To reach a true optimal solution in this case, it is necessary to find better solutions while sneaking away from local optimal solutions by some noise as in simulated annealing. According to the known principle, a loss is indispensable in principle, and a loss destroys a quantum-mechanical superposition state, so a quantum-mechanical effect such as quantum annealing cannot be expected. As a consequence, the accuracy of a solution cannot largely be increased.

BRIEF DESCRIPTION OF THE DRAWINGS

FIG. 6A shows the energy landscape of a problem which the classical model fails to solve 100% in the simulations shown in FIGS. 4A, 4B, 5A, and 5B;

FIG. 11 is a view showing a circuit capable of adjusting a parameter of the coupling resonator;

FIG. 12 is a graph showing the detuning dependence of the energy gap between the ground state and second excited state of the Kerr parametric oscillator;

FIG. 18 is a graph showing the simulation result of initialization when using the present embodiment in a gate type universal quantum computer;

FIG. 19 is a graph showing the simulation result of a phase shift gate when using the present embodiment in the gate type universal quantum computer;

DETAILED DESCRIPTION

Embodiments will be explained in detail below with reference to the accompanying drawings.

The present embodiments have been made in consideration of the above situation, and have as its object to provide a quantum computation apparatus and quantum computation method capable of rapidly solving a combinatorial optimization problem by a new principle using both an oscillation phenomenon and quantum-mechanical effect.

According to one embodiment, a quantum computation apparatus includes a plurality of quantum nonlinear oscillators, a controller, and a measuring device. Each of the quantum nonlinear oscillators implements superposition of distinguishable quantum states by bifurcating one quantum state via a quantum adiabatic change controlled by the bifurcation parameter. The quantum nonlinear oscillators couple with each other by nondissipative coupling accompanying no loss. The controller individually controls the bifurcation parameters of the quantum nonlinear oscillators. A measuring device measures outputs from the quantum nonlinear oscillators.

Figure 1:
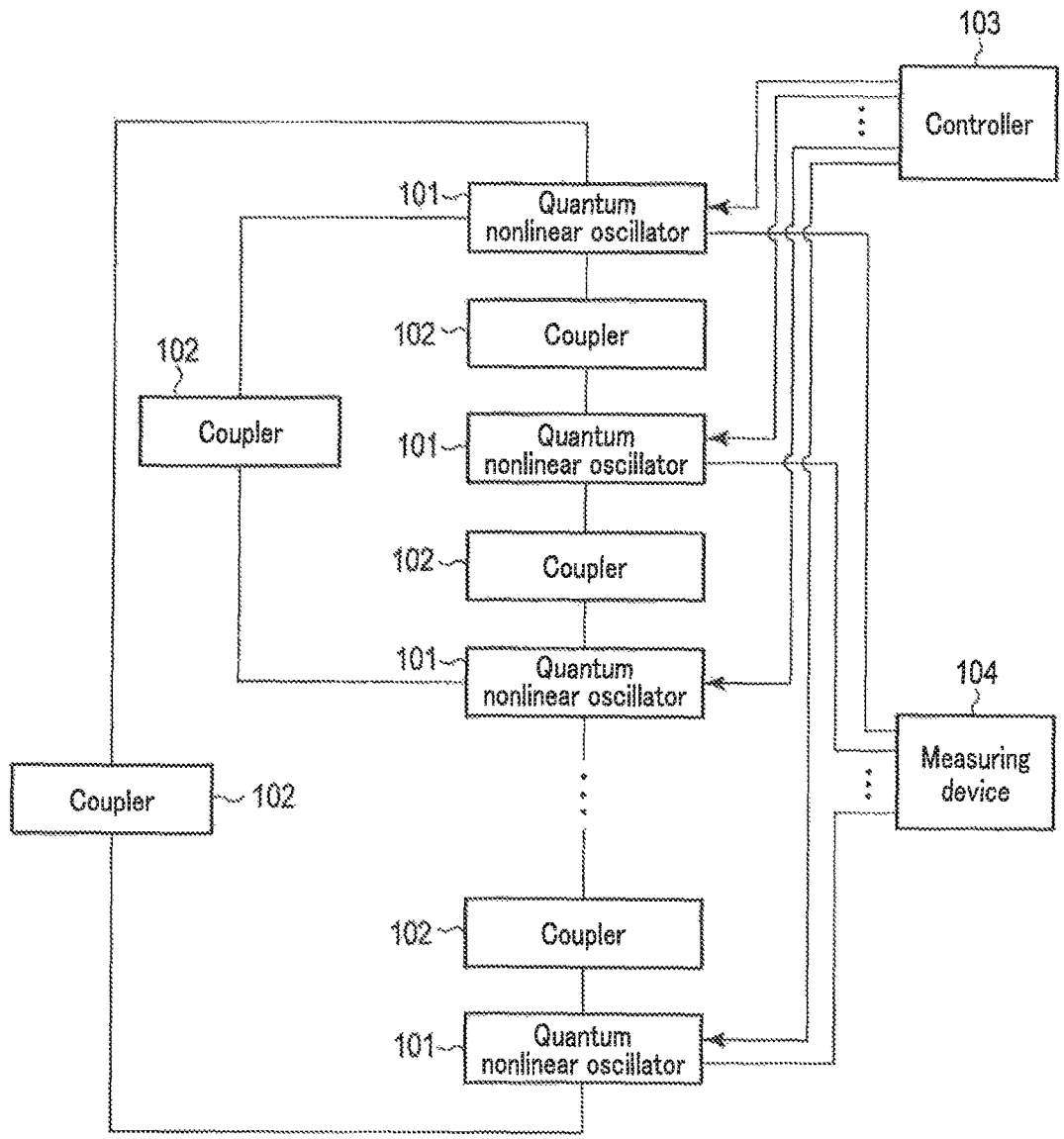
FIG. 1 is a view showing a quantum computation apparatus of an embodiment.

As shown in FIG. 1, the basic elements of a quantum computation apparatus of this embodiment include a plurality of quantum nonlinear oscillators 101, a plurality of couplers 102 for coupling the quantum nonlinear oscillators 101, a controller 103 for controlling a system parameter, and a measuring device 104 for measuring the quantum nonlinear oscillators 101. First, an explanation will be made by referring to a block diagram shown in FIG. 1 and a flowchart of a quantum computation method shown in FIG. 2.

When used singly, the quantum nonlinear oscillator 101 can generate superposition of distinguishable quantum states by bifurcating one quantum state via a quantum adiabatic change using a system parameter (called a bifurcation parameter) as a control parameter. Also, the loss of the quantum nonlinear oscillator 101 is so small that the influence is negligible. (There is no loss in an ideal case.)

Each coupler 102 losslessly and nondissipatively couples two of the plurality of quantum nonlinear oscillators 101.

The couplers 102 are shown even when no actual devices exist and the quantum nonlinear oscillators 101 directly couple with each other.

The controller 103 individually controls the bifurcation parameters of all the quantum nonlinear oscillators 101.

The measuring device 104 measures outputs from all the quantum nonlinear oscillators 101. The quantum computation apparatus can obtain computation results based on the measurement results. For example, the measuring device 104 measures the parity of the phase of an electric field amplitude.

The quantum computation apparatus and quantum computation method will be described in more detail below.

First, the quantum nonlinear oscillator 101 will be explained in detail. The quantum nonlinear oscillator 101 shows "a quantum-mechanical bifurcation phenomenon" which changes to superposition of distinguishable quantum states via a quantum adiabatic change using the bifurcation parameter as a control parameter. ±1 of the Ising spin are associated with two bifurcated distinguishable quantum states. This oscillator will be explained by appropriately taking a parametric oscillator (to be referred to as "a Kerr parametric oscillator" hereinafter) having a Kerr effect as a practical example. However, the same effect can be expected from any quantum nonlinear oscillator exhibiting the quantum-mechanical bifurcation phenomenon.

The time evolution of the Kerr parametric oscillator is given by a Hamiltonian H below:

$$H = H_{para} + H_{Kerr} + H_{det}, \quad (1)$$

$$H_{para} = -\hbar\frac{p}{2}(a^\dagger a^\dagger + aa), H_{Kerr} = \hbar\frac{K}{2}a^\dagger a^\dagger aa, H_{det} = \hbar\Delta a^\dagger a$$

where $$a, a^\dagger \quad (2)$$

respectively represent an annihilation operator and creation operator of the oscillator. Also, $H_{para}$, $H_{Kerr}$, and $H_{det}$ are Hamiltonians respectively corresponding to parametric amplification, the Kerr effect, and detuning, p is the pump amplitude of parametric amplification, K is a Kerr coefficient, and $\Delta$ is detuning. (Letting $\omega$ be the eigenfrequency of the oscillator, and $\omega_p$ is the pump frequency for parametric amplification, detuning is defined by $\Delta=\omega-\omega_p/2$.) Unless otherwise specified, p, K, and $\Delta$ are nonnegative real numbers hereinafter.

Unlike a normal parametric oscillator used in patent literature "WO 2015/006494", the Kerr parametric oscillator of this embodiment has the Kerr effect instead of a two-photon loss, has detuning instead of a one-photon loss, and ideally has no loss.

The initial state of the quantum nonlinear oscillator 101 is a vacuum state (a zero-eigenvalue eigenstate of the annihilation operator), and, when the pump amplitude p (the bifurcation parameter of the Kerr parametric oscillator) of parametric amplification is gradually increased from zero, the quantum nonlinear oscillator 101 starts bifurcating (oscillating) when p=$\Delta$, and causes quantum-mechanical superposition of two oscillation states having equal magnitudes and opposite signs as an amplitude x when p>$\Delta$. The amplitude x is represented by:

$$x=(a+a^\dagger)/2 \quad (3).$$

This is the above-described quantum-mechanical bifurcation phenomenon. The two oscillation states having opposite signs are associated with ±1 of the Ising spin. It should be noted that the bifurcation point (the oscillation threshold) is determined by detuning. (By contrast, the oscillation threshold of the normal parametric oscillator used in patent literature "WO 2015/006494" is determined by a one-photon loss.)

The quantum computation apparatus of this embodiment using the plurality of quantum nonlinear oscillators 101 explained above will now be explained. The quantum computation apparatus of this embodiment finds an optimal solution by using a quantum adiabatic change where the initial state is a vacuum. Therefore, the initial Hamiltonian must have a vacuum as the eigenstate of a minimum eigenvalue. (Now K is positive. If K is negative, invert all signs, and reread "positive" as "negative", "minimum" as "maximum", and the like.) This condition is called "the initial condition of the quantum adiabatic change" here. This condition is met by, e.g., setting detuning so as to meet the following condition (e.g., the controller 103 performs this setting). (An initial setting stage: step S201 in FIG. 2)

Condition of detuning ($\Delta_i$ is detuning of the ith quantum nonlinear oscillator):

$$M = \begin{pmatrix} \Delta_1 & -\xi_0 J_{1,2} & \cdots \\ -\xi_0 J_{2,1} & \Delta_2 & \\ \vdots & & \ddots \end{pmatrix} \quad (4)$$

That is, a matrix M defined by:

$$M_{i,i} = \Delta_i, \; M_{i,j} = -\xi_0 J_{i,j} (i \neq j) \quad (5)$$

is a positive semidefinite (i.e., all eigenvalues are nonnegative).

Figure 2:
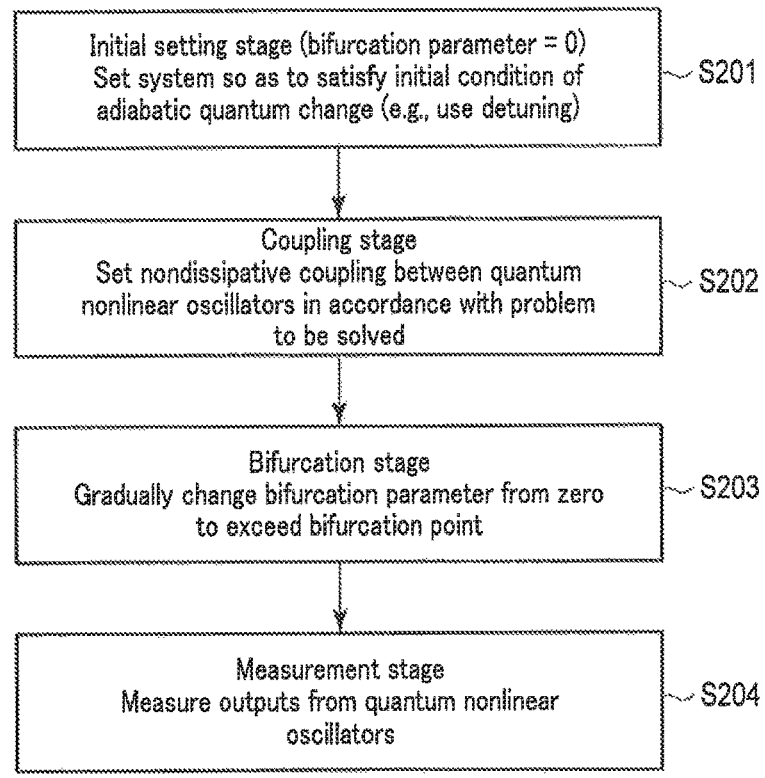
FIG. 2 is a flowchart showing a quantum computation method of the embodiment.
Figure 3:
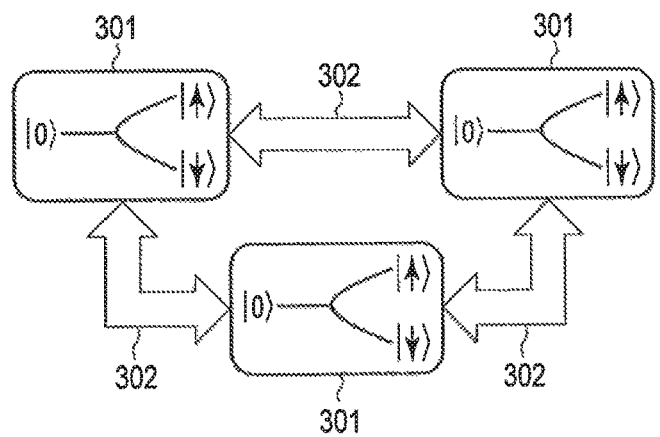
FIG. 3 is a conceptual view of the quantum computation apparatus of the embodiment.

After the initial value setting stage, nondissipative coupling is set between the quantum nonlinear oscillators in accordance with a problem to be solved (a coupling stage: step S202 in FIG. 2). As shown in a conceptual view of FIG. 3, the quantum computation apparatus of this embodiment is configured by a network which properly couples (302) a plurality of quantum nonlinear oscillators 301 in accordance with a problem. The apparatus will be explained below by taking, as an example, an Ising model in which an energy function is given by E to be presented below. E will be called "Ising energy" hereinafter:

$$E = -\frac{1}{2} \sum_{i=1}^{N} \sum_{j=1}^{N} J_{i,j} s_i s_j \quad (6)$$

where $s_i$ represents the value of the ith Ising spin, and takes ±1. Also, a coupling constant $\{J_{i,j}\}$ satisfies $J_{i,i} = 0$ and $J_{i,j} = J_{j,i}$.

The quantum computation apparatus of this embodiment properly couples N quantum nonlinear oscillators with respect to the abovementioned Ising model, thereby implementing a coupling Hamiltonian $H_J$ below:

$$H_J = -\hbar \frac{\xi_0}{2} \sum_{i=1}^{N} \sum_{j=1}^{N} J_{i,j} \left( a_i^\dagger a_j + a_i a_j^\dagger \right) = -\hbar \xi_0 \sum_{i=1}^{N} \sum_{j=1}^{N} J_{i,j} a_i^\dagger a_j \quad (7)$$

where $\xi$ is a positive constant which determines the magnitude of coupling energy.

It should be noted that the abovementioned coupling does not accompany any loss. Therefore, this coupling is called "nondissipative coupling". (By contrast, the coupling method by mutual injection used in patent literature "WO 2015/006494" is not describable by Hamiltonian like this and dissipative.) Also, the aforementioned coupling is standard linear coupling, and physical implementation is easy.

When the abovementioned initial condition is met, the bifurcation point (the oscillation threshold) of the network decreases as the coupling energy of an oscillation pattern decreases. Minimization of the coupling energy is approximately minimization of the Ising energy. Therefore, when a vacuum state is set as the initial state and oscillation is caused by gradually increasing the bifurcation parameter from zero, a superposition state of oscillation patterns having a low Ising energy is obtained (a bifurcation stage: step S203 in FIG. 2). The capability of automatically obtaining the low-Ising-energy state as described above is the merit of the method of using the oscillation phenomenon, and this makes it possible to avoid the Ising energy from being trapped to a high local optimal solution. Also, near the bifurcation point, only one low-Ising-energy state is not selected, but quantum-mechanical superposition of a plurality of low-Ising-energy states is obtained by quantum fluctuation. Consequently, it is expected that a global optimal solution is found at a high probability.

When the bifurcation parameter is further increased, the state of the network finally converges to the global optimal solution. This is guaranteed by the quantum adiabatic theorem under the assumption that the adiabatic conditions are met. Initially, the bifurcation parameter is zero, and the vacuum state as the initial state is the ground state of the whole system. When the bifurcation parameter is sufficiently slowly changed, the state of the whole system changes to the final Hamiltonian ground state based on the quantum adiabatic theorem. When the bifurcation parameter is sufficiently large, nonlinear terms (parametric amplification and the Kerr effect in the case of a Kerr parametric oscillator) become dominant, so all the oscillation amplitudes of the oscillators have almost equal magnitudes, and only the phases (the signs of x described above) are different. Therefore, the phase of each oscillator is measured, and computation results are obtained by the measurement results (a measurement stage: step S204 in FIG. 2). Of Hamiltonians in the whole system, only the coupling Hamiltonian depends on the phase. Under the condition that all the magnitudes are equal and only the phases are different, the coupling Hamiltonian is proportional to the Ising energy. Accordingly, the ground state of the whole system as the final state becomes a state which minimizes the Ising energy, i.e., a state corresponding to the global optimal solution. As described above, near the bifurcation point, superposition of a plurality of low-Ising-energy states is obtained by quantum fluctuation, and this state finally converges to the global optimal solution by a quantum adiabatic change. This presumably demonstrates that the quantum effects work effectively.

As described above, the quantum computation apparatus of this embodiment can solve a combinatorial optimization problem by effectively using both the oscillation phenomenon (bifurcation phenomenon) and the quantum effects, by the network in which quantum nonlinear oscillators ideally accompanying no loss are connected by nondissipative coupling accompanying no loss either.

To confirm the quantum effects, a quantum model of the quantum computation apparatus of this embodiment using the Kerr parametric oscillator and a classical model were simulated and compared. The comparison results will be explained below with reference to FIGS. 4A, 4B, 5A, and 5B. In the quantum model, a Schrödinger equation using the abovementioned Hamiltonian was numerically solved. In the classical model, the following ordinary differential equations were numerically solved:

$$\frac{dx_i}{dt} = y_i \{\Delta_i + p + K(x_i^2 + y_i^2)\} - \xi_0 \sum_j J_{i,j} y_j \quad (8)$$

$$\frac{dy_i}{dt} = x_i \{-\Delta_i + p - K(x_i^2 + y_i^2)\} - \xi_0 \sum_j J_{i,j} x_j.$$

The above equations are derived from the following Heisenberg equation for the annihilation operator:

$$\frac{da_i}{dt} = -i\Delta_i a_i + ip a_i^\dagger - iK a_i^\dagger a_i a_i + i\xi_0 \sum_{j=1}^{N} J_{i,j} a_j. \quad (9)$$

Then, classical approximation represented by the following expression is performed on this annihilation operator:

$$a_i \rightarrow x_i + iy_i \quad (10)$$

where $x_i$ and $y_i$ are real variables.

In this simulation, four-spin Ising problems were solved. One thousand instances were made by randomly setting coupling constants $\{J_{i,j}\}$ by uniform random numbers of $-1$ to 1, and expectation values of the error probability (a probability at which no global optimal solution is obtained) and the residual energy (a difference between the Ising energy obtained in the solution and a true Ising energy minimum value) were estimated for each instance. FIGS. 4A, 4B, 5A, and 5B are histograms showing the results.

Figure 4A:
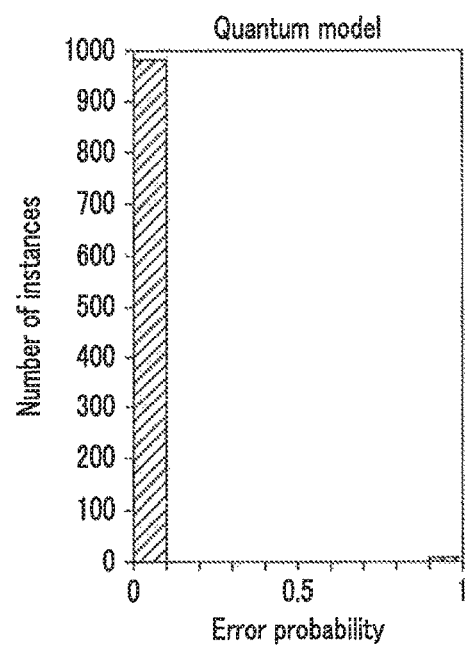
FIG. 4A is a graph showing the result of the error probability of numerical simulation using a quantum model.
Figure 4B:
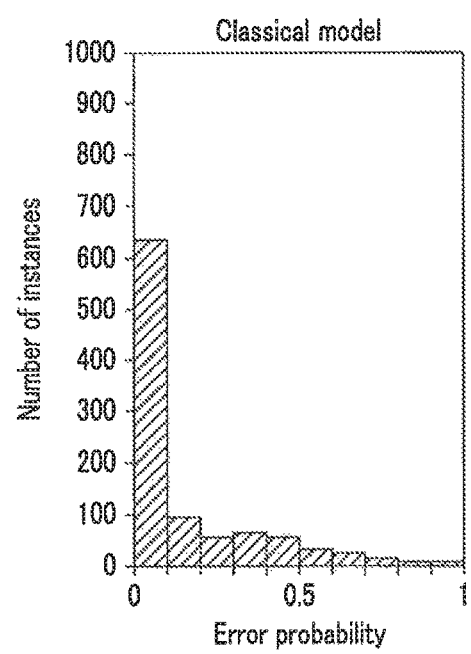
FIG. 4B is a graph showing the result of the error probability of numerical simulation using a classical model.
Figure 5A:
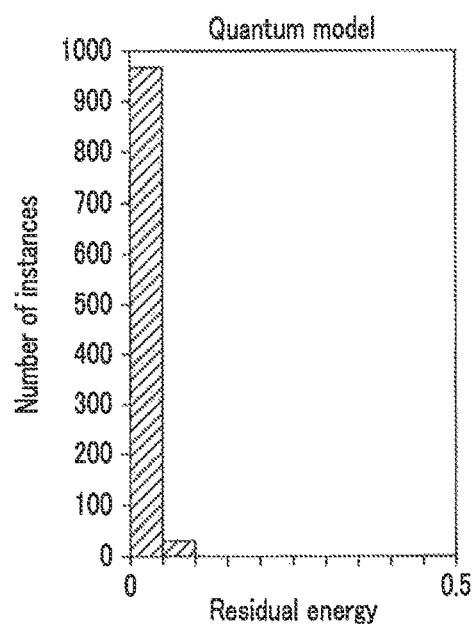
FIG. 5A is a graph showing the result of the residual energy of numerical simulation using a quantum model.
Figure 5B:
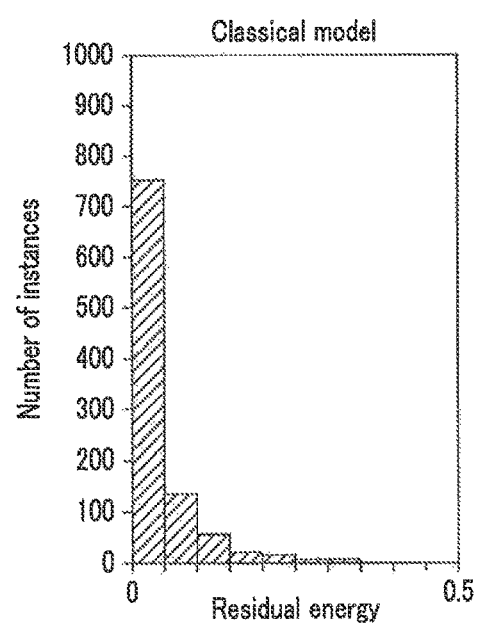
FIG. 5B is a graph showing the result of the residual energy of numerical simulation using a classical model.

FIG. 4B shows that even the classical model finds global optimal solutions in many instances. This is so because the aforementioned mechanism "oscillation occurs earlier for a lower Ising energy" holds in the classical model as well. On the other hand, FIG. 4B also reveals that the classical model fails to solve many instances with high probability. The classical model fails to solve these instances probably because they are trapped to local optimal solutions. By contrast, FIG. 4A demonstrates that the number of instances which the quantum model fails to solve with high probability dramatically decreases. This is so perhaps because by quantum fluctuation the trap to local optimal solutions is avoided, and by the quantum adiabatic theorem the state converges to global optimal solutions.

Figure 6B:
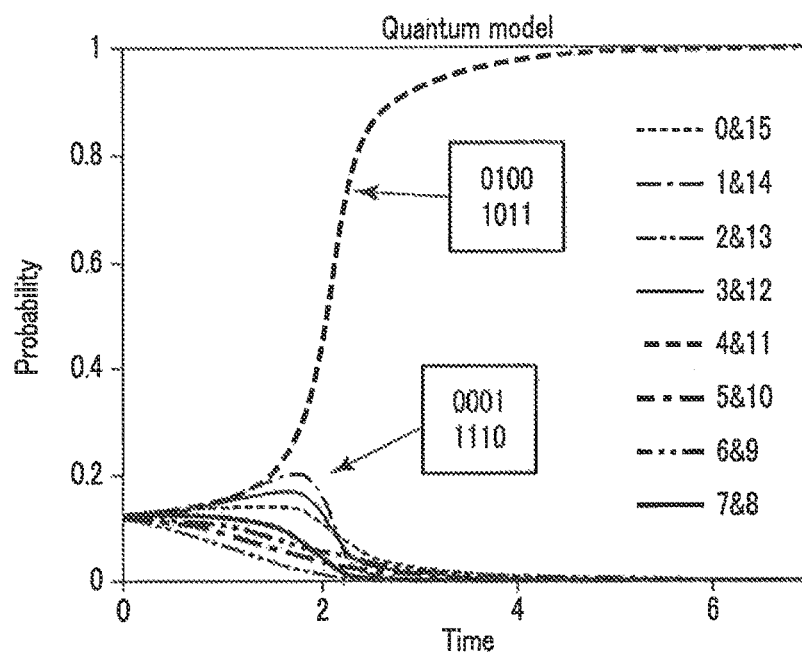
FIG. 6B is a graph showing the time evolution of the probability of each spin state in the quantum model with respect to the problem shown in FIG. 6A.
Figure 6C:
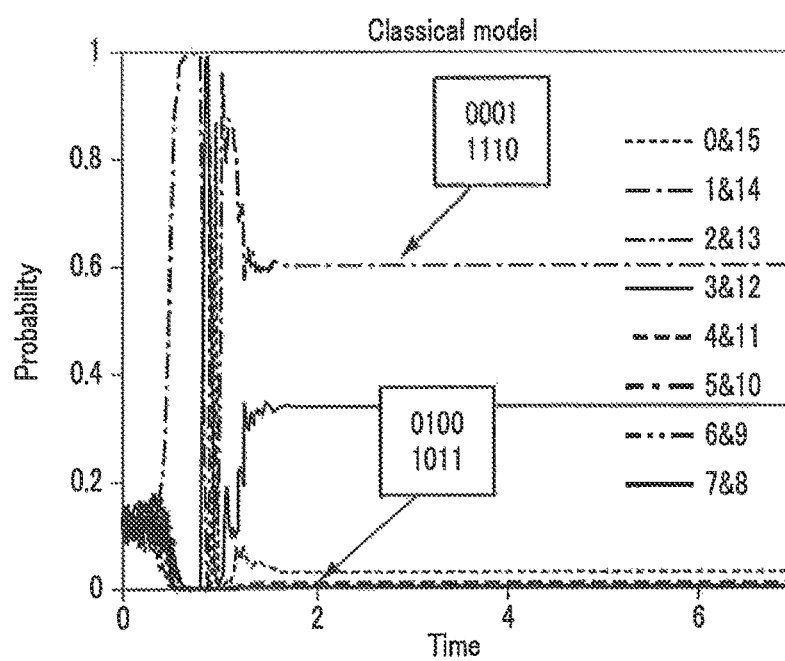
FIG. 6C is a graph showing the time evolution of the probability of each spin state in the classical model with respect to the problem shown in FIG. 6A.

To confirm the foregoing, an instance which the classical model fails to solve 100% will be examined in detail below. FIG. 6A shows the energy landscape of this instance, and FIGS. 6B and 6C respectively show changes in probability of spin configurations with time of the quantum model and classical model. Referring to FIGS. 6B and 6C, 1 and $-1$ of spins are respectively associated with 0 and 1 of bits. Global optimal solutions which minimize Ising energy $E_{Ising}$ are 0100 and 1011, and "Distance from optimal solution" in the energy landscape represents a Hamming distance from a global optimal solution in bit representation. 0001 and 1110 are local optimal solutions. In the classical model, as shown in FIG. 6C, the probability of 0001 or 1110 as local optimal solutions rises to 1 first, and oscillates between them and 0011 or 1100, which are adjacent to 0001 and 1110, after that, and the probability of global optimal solutions finally becomes almost zero. On the other hand, in the quantum model as shown in FIG. 6B, a superposition state in which the probability of spin configurations having relatively low Ising energy is high is obtained first, and the probability of global optimal solutions finally converges to 1. This result can be interpreted that by the effect of quantum fluctuation the trap to local optimal solutions is avoided, and by the quantum adiabatic theorem the state converges to a global optimal solution.

From the foregoing, it was confirmed that this computation apparatus described above operates as expected.

A method of obtaining a high speed (high accuracy) in computation by adjusting detuning will be proposed below. ("High accuracy" means that a difference from an optimal value of an objective function is small. This is equivalent to a low residual energy in the Ising problem.)

The speed of a quantum adiabatic change can be increased as a minimum value of the energy gap between the ground state and excited state increases. (The accuracy increases for the same computation time.) FIG. 12 shows the detuning dependence of the energy gap between the ground state and second excited state of one Kerr parametric oscillator. (In the Kerr parametric oscillator, transition between the ground state and first excited state is inhibited from the parity inversion symmetry of Hamiltonian, so it is sufficient to consider the energy gap between the ground state and second excited state.) FIG. 12 shows that a minimum value of the energy gap increases as detuning increases. According to FIG. 12, the values are about 1 (p/K) when $\Delta=0$, about 3 (p/K) when $\Delta=K$, about 4.5 (p/K) when $\Delta=2K$, and about 7.7 (p/K) when $\Delta=5K$. When solving an optimization problem by the network, therefore, it can be expected to enlarge the energy gap by increasing detuning, and obtain a high speed (high accuracy).

Figure 13:
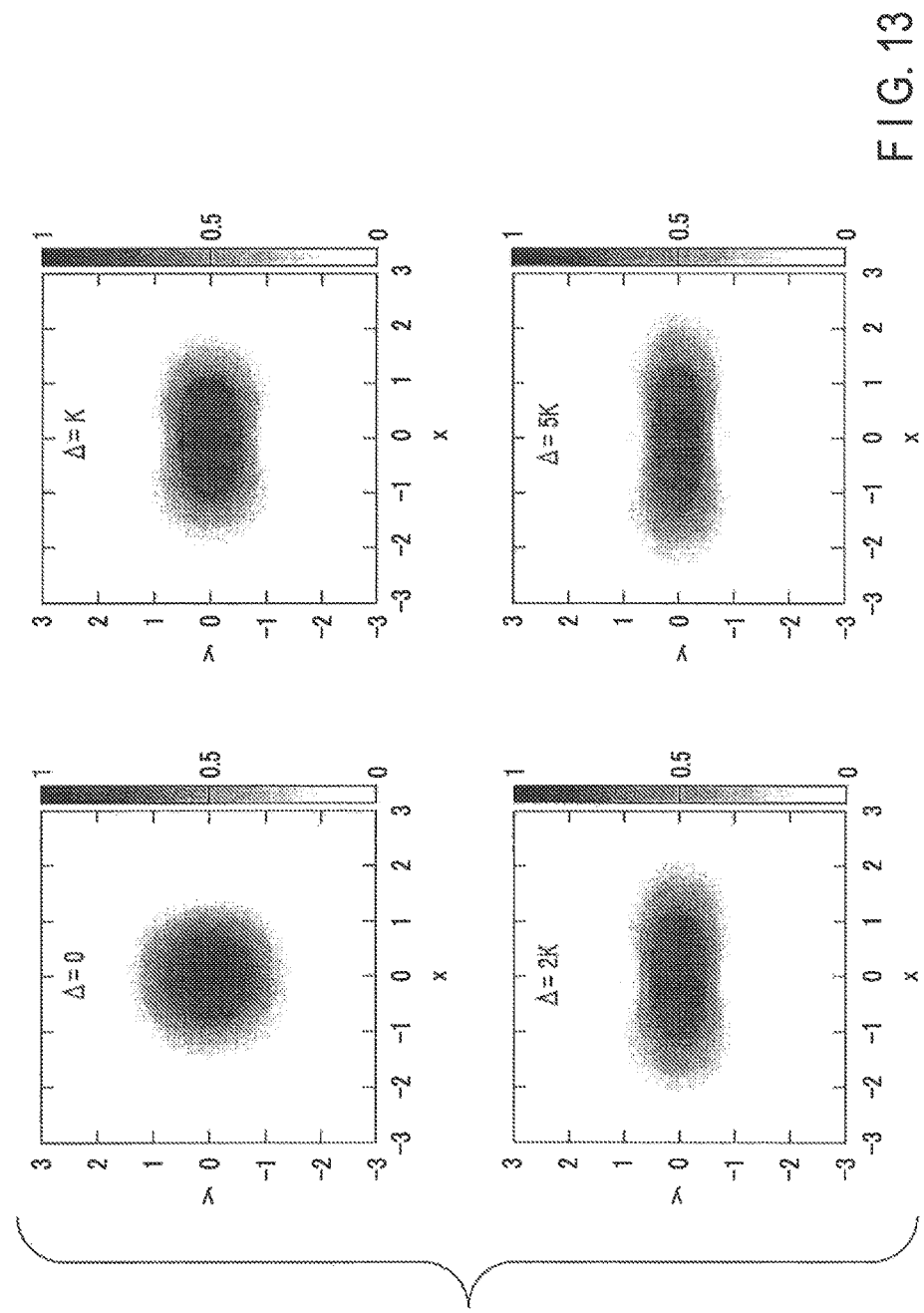
FIG. 13 depicts graphs showing the detuning dependence of a Wigner function at the bifurcation point of the Kerr parametric oscillator.

Improving the accuracy by the increase of detuning is expected from the viewpoint of quantum fluctuation as well. FIG. 13 shows a Wigner function at the bifurcation point $(p=\Delta)$ with respect to each detuning shown in FIG. 12. (A Wigner function is known as a quasiprobability density function on a phase space (a space spanned by the two variables x and y in the aforementioned classical model.) As shown in FIG. 13, a quantum fluctuation in the x direction at the bifurcation point increases as detuning increases. Accordingly, trapping to a local optimal solution occurs more hardly as detuning increases. The effect of quantum fluctuation increases especially when detuning is larger than K.

To confirm the foregoing, simulation of solving the same 1,000 instances of the four-spin problem as described above was performed. (Only the quantum model will be processed here.) Assume that detuning is constant and the same in all the oscillators. The following three values were selected as the values of detuning.

1. $\Delta=3\xi_0$
2. $\Delta=10\xi_0$
3. $\Delta=20\xi_0$

The first value is a relatively small value among values meeting the initial condition of a quantum adiabatic change (the condition that the matrix M of equation (4) is a positive semidefinite), and two other values are relatively large values. (Note that $\xi_0=0.2K$ in this simulation.) Also, p was increased from zero to $5K+\Delta$ in proportion to time. ($5K+\Delta$ was set in order to equalize the final average numbers of photons at approximately 5.) The computation time (the sweep time of p) was set at $100/K$.

Figure 14:
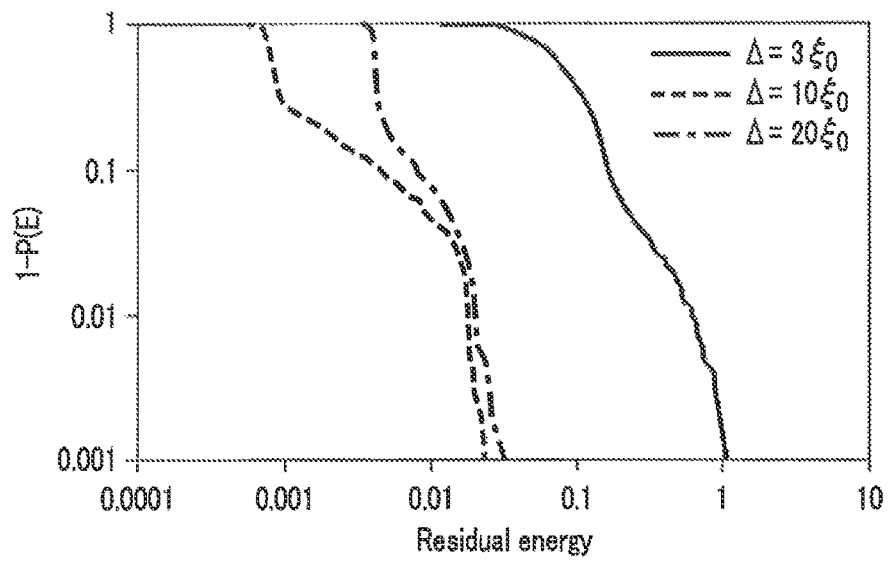
FIG. 14 is a graph showing simulation results when detuning is set at three constant values.

FIG. 14 shows the results of the simulation. That is, a distribution function P(E) of the residual energy (the probability at which the residual energy is E or less) was estimated from the results of the residual energy of 1,000 instances. FIG. 14 is a log-log graph showing values obtained by subtracting the estimated results from 1 (i.e., 1−P(B)). FIG. 14 means that the lower the curve for the same E, the higher the accuracy. It was confirmed from FIG. 14 that the accuracy increased as expected when detuning was relatively large. On the other hand, the accuracy was higher when $\Delta=10\xi_0$ than when $\Delta=20\xi_0$, so the larger the better does not hold. From the foregoing, there are appropriate values of detuning satisfying the condition that the matrix M of equation (4) is a positive definite. That is, it is desirable to append additional detuning on purpose, perform computation several times while changing the value, and select a solution which minimizes the residual energy.

Figure 15:
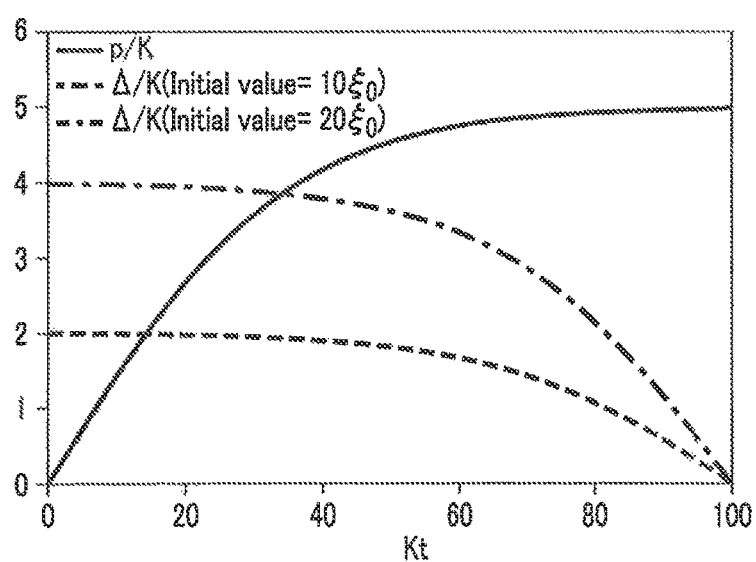
FIG. 15 is a graph showing the settings of detuning and the pump amplitude in simulation shown in FIG. 16.

If detuning is too large, the above-described assumption "when the bifurcation parameter is sufficiently large, non-linear terms (parametric amplification and the Kerr effect in the Kerr parametric oscillator) become dominant, so all the oscillation amplitudes of the oscillators have almost equal magnitudes, and only the phases (the signs of x described above) are different" does not hold any longer, and a model error caused by this increases. It is presumably possible to eliminate this model error by finally changing detuning to zero. (This effect is obtained when detuning is K or less even if it is not completely zero. Therefore, "changing detuning to zero" means that detuning is changed to K or less.) To confirm the foregoing, simulation was performed, where the energy gap is enlarged initially by taking large detuning, and, after p increased to some extent, finally changing detuning to zero. As the initial values of detuning, two values, i.e., $\Delta=10\xi_0$ and $\Delta=20\xi_0$ were checked for comparison with the simulation shown in FIG. 14. Also, the final value of p was set at 5K for comparison with the simulation shown in FIG. 13. (That is, the final average number of photons was approximately 5.) FIG. 15 shows changes in $\Delta$ and p set as described above with time.

Figure 16:
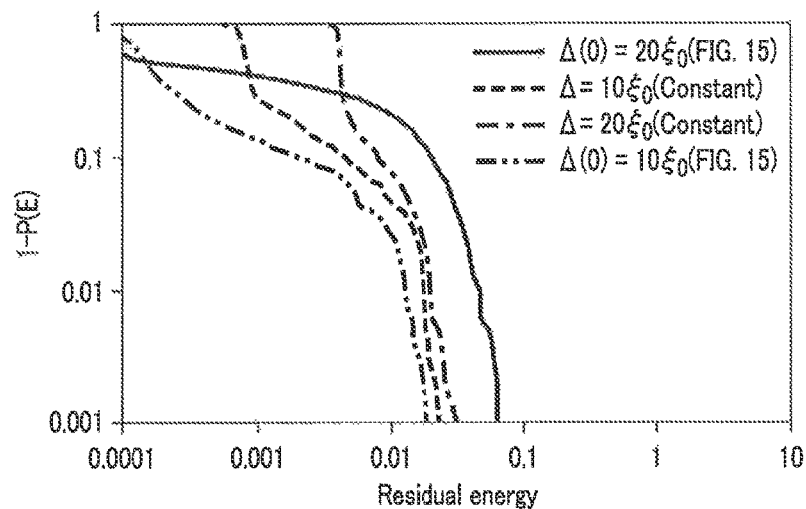
FIG. 16 is a graph comparing simulation results when detuning is controlled to be finally zero as shown in FIG. 15 and set at a constant value (FIG. 14)

FIG. 16 shows comparison of the simulation results shown in FIG. 15 with those shown in FIG. 14.

Unlike when detuning is constant, the probability that the residual energy becomes very small, i.e., 0.001 or less increases when detuning is controlled as shown in FIG. 15. This is so probably because the abovementioned model error disappears. On the other hand, when $\Delta(0)=20\xi_0$ under the control shown in FIG. 15, the probability that the residual energy increases rises. This is so perhaps because the adiabatic conditions worsen as a result of the control shown in FIG. 15. Compared to this, when $\Delta(0)=10\xi_0$ under the control shown in FIG. 15, the accuracy is higher as a whole than when detuning is constant. This is so presumably because the model error can be eliminated without worsening the adiabatic conditions. From the foregoing, it is desirable to perform computation several times while changing values for both a case in which detuning is constant and a case in which detuning is finally changed to zero, and select a solution which minimizes the residual energy.

Note that the Ising model containing only an interaction term has been processed so far, but E containing a local external magnetic field term can also be processed. This E is as follows:

$$E = -\frac{1}{2}\sum_{i=1}^{N}\sum_{j=1}^{N} J_{i,j} s_i s_j + \sum_{i=1}^{N} h_i s_i. \tag{11}$$

This case will be explained below by taking a Kerr parametric oscillator as an example.

An electromagnetic wave having a frequency of $\omega_p/2$ is input to each Kerr parametric oscillator, thereby implementing the following Hamiltonian:

$$H_{Mag} = \hbar \xi_0 \alpha(t) \sum_{i=1}^{N} h_i (a_i^\dagger + a_j)_o \tag{12}$$

wherein $\alpha(t)$ is equivalent to the magnitude of the amplitude of oscillation, and can be represented as follows in the case of a Kerr parametric oscillator:

$$\alpha(t) = \sqrt{\frac{p(t)}{K}}. \tag{13}$$

$\alpha(t)$ is initially zero and gradually changes together with p(t). When p(t) has become sufficiently large, the magnitudes of the oscillation amplitudes of all oscillators are almost equal, and only the phases are different. Of Hamiltonians in the whole system, only the coupling Hamiltonian and abovementioned $H_{Mag}$ depend on the phase and are proportional to the Ising energy under the condition that all the magnitudes are equal and only the phases are different. As described previously, therefore, a state which finally minimizes the Ising energy by the quantum adiabatic theorem is obtained.

Note that in this embodiment, the amplitude of the electromagnetic wave to be input for a local external magnetic field term is a real number. However, when an imaginary part is added to the amplitude on purpose, the energy gap becomes larger and the accuracy improves in some cases. (The imaginary part is finally zeroed.)

The quantum computation apparatus of this embodiment can rapidly solve a combinatorial optimization problem by the new principle using both the oscillation phenomenon and the quantum-mechanical effect.

This quantum computation apparatus can also be used as a universal quantum computer based on a quantum gate operation, by regarding the two oscillation states of each quantum nonlinear oscillator as quantum bits. The universal quantum computer can rapidly solve problems, e.g., prime factorization, which cannot be solved by the present computers because computation amounts are large. A method of using this quantum computation apparatus as the universal quantum computer will be explained below.

The universal quantum computer based on a quantum gate operation requires five processes, i.e., read of quantum bits, initialization of quantum bits, a phase shift gate, a rotation gate, and an entangling gate. Of these processes, each gate is defined as follows. (The definition of a gate has arbitrariness, and a definition matching the apparatus is selected in this embodiment.)

Phase shift gate:

$$\alpha_0|0\rangle + \alpha_1|1\rangle \to \alpha_0|0\rangle + \alpha_1 e^{i\phi}|1\rangle. \tag{14}$$

Rotation gate:

$$\alpha_0|0\rangle + \alpha_1|1\rangle \to \left(\alpha_0\cos\frac{\theta}{2} - i\alpha_1\sin\frac{\theta}{2}\right)|0\rangle + \left(\alpha_1\cos\frac{\theta}{2} - i\alpha_0\sin\frac{\theta}{2}\right)|1\rangle. \tag{15}$$

Entangling gate:

$$\alpha_{00}|0\rangle|0\rangle + \alpha_{01}|0\rangle|1\rangle = \alpha_{10}|1\rangle|0\rangle + \alpha_{11}|1\rangle|1\rangle \to \alpha_{00}|0\rangle|0\rangle + e^{i\Theta}(\alpha_{01}|0\rangle|1\rangle + \alpha_{10}|1\rangle|0\rangle) + \alpha_{11}|1\rangle|1\rangle. \tag{16}$$

The methods of individual operations will be explained below in order. Assume that all oscillators are decoupled except for the entangling gate.

Readout of quantum bits is the same as readout of Ising spins mentioned earlier.

Initialization of quantum bits is achieved by gradually increasing the pump amplitude from zero to a value $p_0$ larger than the bifurcation point (the oscillation threshold), and changing the state of each oscillator from a vacuum state to a superposition state of two oscillation states:

$$|\sqrt{p_0/K}\rangle + |-\sqrt{p_0/K}\rangle \tag{17}$$

(where a normalization factor is omitted). In this expression, $$|\pm\sqrt{p_0/K}\rangle \tag{18}$$

is a coherent state in which the amplitude is:

$$\pm\sqrt{p_0/K} \tag{19}$$

$$|\sqrt{p_0/K}\rangle \tag{20}$$

is regarded as |0> of a quantum bit, and $$|-\sqrt{p_0/K}\rangle \qquad (21)$$

is regarded as |1> of a quantum bit. (Assuming that $p_0$ is sufficiently large, they are orthogonal.) When represented by quantum bits, the state prepared by this initialization is |0>+|1> (where a normalization factor is omitted). This state matches the initial states of many quantum algorithms (e.g., Shor's factoring algorithm). Note that in this initialization, it is assumed that detuning of each oscillator is finally zero. However, the above-described energy gap consideration reveals that when detuning is initially given a relatively large value (equal to or larger than K), then gradually decreased, and finally zeroed, it is possible to increase the speed or accuracy of a quantum adiabatic change necessary for initialization, compared to a case in which detuning is always zeroed. This was confirmed by numerical simulation. Time T required for initialization was set at 20/K, the pump amplitude was set at:

$$p(t) = 4K\sin^2\frac{\pi t}{2T} \qquad (22)$$

and detuning was set at:

$$\Delta(t) = \Delta_0 \cos^2\frac{\pi t}{2T}. \qquad (23)$$

Under the conditions, fidelity F between the finally obtained state and an ideal initial state:

$$|\sqrt{p_0/K}\rangle + |-\sqrt{p_0/K}\rangle \qquad (24)$$

(where a normalization factor is omitted) was calculated for each $\Delta_0$. (F between two state vectors is defined by the square of the inner product.) FIG. 18 shows the result. As expected, a high fidelity was obtained when $\Delta_0$ was equal to or larger than K.

Next, the method of executing the phase shift gate will be explained. The following Hamiltonian is implemented by an external excitation pulse $E_{in}(t)$ while the pump amplitude and detuning are respectively kept at $p_0$ and zero:

$$H = \hbar\, E_{in}(t)(a+a^\dagger) \qquad (25).$$

Note that this pulse has an envelope which changes sufficiently slowly so that a quantum adiabatic change occurs. When $E_{in}(t)$ is always much smaller than K, the energy of each quantum bit shifts as follows in accordance with the state:

$$|0\rangle \ldots \frac{\hbar\, E_{in}(t)\langle\sqrt{p_0/K}|(a+a^\dagger)|\sqrt{p_0/K}\rangle}{\sqrt{p_0/K}} = 2\hbar\, E_{in}(t) \qquad (26\text{-}1)$$

$$|1\rangle \ldots \frac{\hbar\, E_{in}(t)\langle-\sqrt{p_0/K}|(a+a^\dagger)|-\sqrt{p_0/K}\rangle}{(t)\sqrt{p_0/K}} = -2\hbar\, E_{in}(t) \qquad (26\text{-}2).$$

This implements a phase shift gate having an angle φ below (T is the gate time):

$$\varphi = -4\sqrt{p_0/K}\int_0^T E_{in}(t)dt \qquad (27).$$

The foregoing was confirmed by numerical simulation. After initialization was performed by the same setting as that of the above-described initialization simulation, the external excitation pulse $E_{in}(t)$ was changed as follows (from the above result, the phase shift gate having the angle φ is executed by this):

$$E_{in}(t) = \frac{\phi}{2\sqrt{p_0/KT}}\sin^2\frac{\pi t}{T}. \qquad (28)$$

The gate time T was set to 5/K. The fidelity F between the finally obtained state and an ideal state:

$$|\sqrt{p_0/K}\rangle + e^{i\phi}|-\sqrt{p_0/K}\rangle \qquad (29)$$

(where a normalization factor is omitted) was calculated. FIG. 19 shows the result. As shown in FIG. 19, a very high fidelity was obtained for φ of −π to π.

The method of executing the rotation gate will now be explained. Detuning is changed like a pulse while the pump amplitude is kept at $p_0$. Note that this pulse has an envelope which changes sufficiently slowly so that a quantum adiabatic change occurs. When detuning increases to some extent, the even state and odd state of the photon number parity which is degenerated when detuning is zero break up, thereby generating a relative phase θ depending on the energy difference. Consequently, after the pulse-like change of detuning, the state of a quantum bit changes as follows:

$$\alpha_0|0\rangle + \alpha_1|1\rangle \to \frac{\alpha_0+\alpha_1}{\sqrt{2}}\frac{|0\rangle+|1\rangle}{\sqrt{2}} + \frac{\alpha_0-\alpha_1}{\sqrt{2}}e^{i\theta}\frac{|0\rangle-|1\rangle}{\sqrt{2}} = e^{i\frac{\theta}{2}}\left[\left(\alpha_0\cos\frac{\theta}{2} - i\alpha_1\sin\frac{\theta}{2}\right)|0\rangle + \left(\alpha_1\cos\frac{\theta}{2} - i\alpha_0\sin\frac{\theta}{2}\right)|1\rangle\right]. \qquad (30)$$

This is a rotation gate having an angle θ except for a phase factor affecting the whole. Since this phase factor affecting the whole can be neglected, the rotation gate is thus achieved. The foregoing was confirmed by numerical simulation. In this simulation, initialization and a phase shift gate of φ=π/2 were first performed by the same setting as that of the above-described simulation, thereby preparing the initial state of this simulation:

$$\frac{\left|\sqrt{p_1/K}\right\rangle + i\left|-\sqrt{p_0/K}\right\rangle}{\sqrt{2}}. \qquad (31)$$

After that, detuning was changed like a pulse as follows:

$$\Delta(t) = \Delta_0 \sin^2\frac{\pi t}{T} \qquad (32)$$

Figure 20:
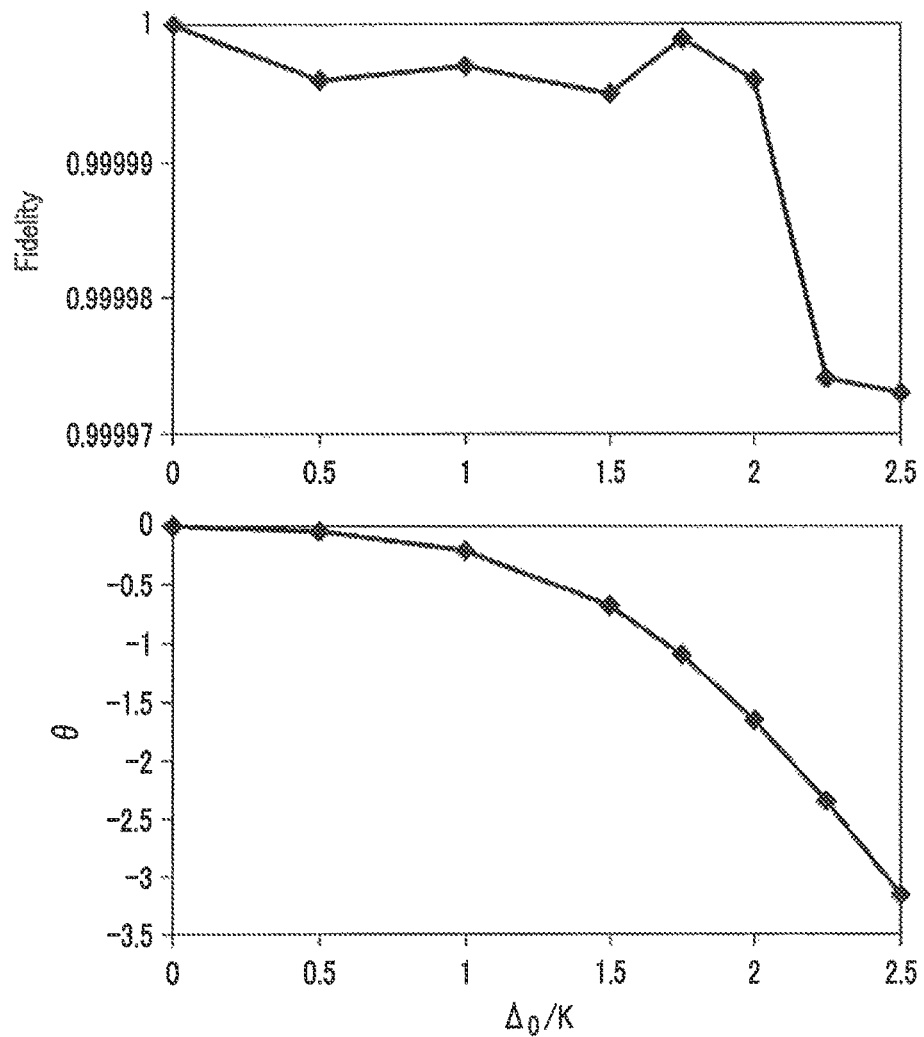
FIG. 20 is a graph showing the simulation result of a rotation gate when using the present embodiment in the gate type universal quantum computer.

(where T is the gate time). T=10/K in this simulation. The fidelity between the finally obtained state and the ideal output state of the rotation gate having the angle θ was calculated for each $\Delta_0$, and θ at which the fidelity was maximum and the maximum value of the corresponding fidelity were obtained. FIG. 20 shows the results. As shown in FIG. 20, it was possible to obtain θ of −π to 0 and a sufficiently high fidelity.

Finally, the method of executing the entangling gate will be explained. A coupling coefficient g between two oscillators as execution targets of the entangling gate is changed like a pulse while the pump amplitude and detuning are respectively kept at $p_0$ and zero, thereby implementing the following Hamiltonian:

$$H = \hbar\, g(t)(a_2^\dagger a_1 + a_1^\dagger a_2) \qquad (33)$$

Where $$a_1, a_2 \qquad (34)$$

is the annihilation operator of each quantum bit. Note that this pulse has an envelope which changes sufficiently slowly so that a quantum adiabatic change occurs. When g(t) is always much smaller than K, the energy of two quantum bits shifts as follows in accordance with the state:

$$|0\rangle|0\rangle \ldots 2\hbar\, g(t)p_0/K \qquad (35\text{-}1)$$

$$|0\rangle|1\rangle \ldots -2\hbar\, g(t)p_0/K \qquad (35\text{-}2)$$

$$|1\rangle|0\rangle \ldots -2\hbar\, g(t)p_0/K \qquad (35\text{-}3)$$

$$|1\rangle|1\rangle \ldots 2\hbar\, g(t)p_0/K \qquad (35\text{-}4)$$

As a consequence, the following entangling gate having an angle $\Theta$ is implemented (T is the gate time):

$$\Theta = -\frac{4p_0}{K}\int_0^T g(t)dt. \qquad (36)$$

The foregoing was confirmed by numerical simulation. After two quantum bits were initialized by the same setting as that of the above-described initialization simulation, the coupling coefficient g(t) was changed as follows:

$$g(t) = \frac{\Theta}{2p_0 T/K}\sin^2\frac{\pi t}{T} \qquad (37)$$

(from the above result, the entangling gate having the angle $\Theta$ is executed by this). The gate time T was set at 5/K. The fidelity F between the finally obtained state and an ideal state:

$$|\sqrt{p_0/K}\rangle\,|\sqrt{p_0/K}\rangle + |-\sqrt{p_0/K}\rangle\,|-\sqrt{p_0/K}\rangle + e^{i\Theta}(|-\sqrt{p_0/K}\rangle\,|\sqrt{p_0/K}\rangle + |\sqrt{p_0/K}\rangle\,|-\sqrt{p_0/K}\rangle) \qquad (38)$$

Figure 21:
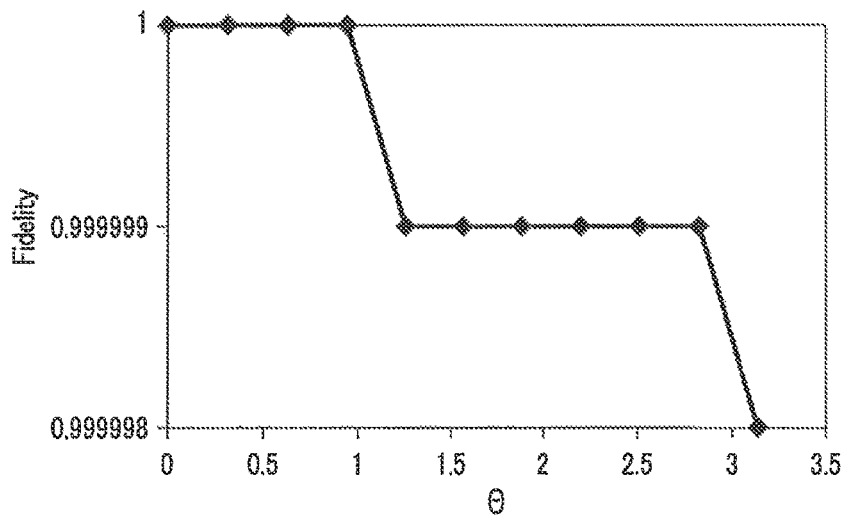
FIG. 21 is a graph showing the simulation result of an entangling gate when using the present embodiment in the gate type universal quantum computer.

(where a normalization factor is omitted) was calculated. FIG. 21 shows the result. As shown in FIG. 21, a very high fidelity was obtained for $\Theta$ of 0 to $\pi$.

It should be noted that all of the three kinds of quantum gate operations are implemented by controlling not a geometric phase (e.g., a Berry phase or holonomy), but a dynamical phase (a phase shift depending on the energy difference) caused by the quantum adiabatic change. (This quantum adiabatic change indicates a process in which the state of each oscillator is confined in a Hilbert space spanned by two almost degenerate ground states of each oscillator.) Note also that when for avoiding degeneracy of the even and odd states of the photon number parity in the rotation gate, the pump amplitude is not sufficiently decreased, but detuning is sufficiently increased. (The energy gap can be held larger when detuning is increased than when the pump amplitude is decreased. This makes a quantum adiabatic change having a higher speed or higher accuracy possible.)

Figure 22:
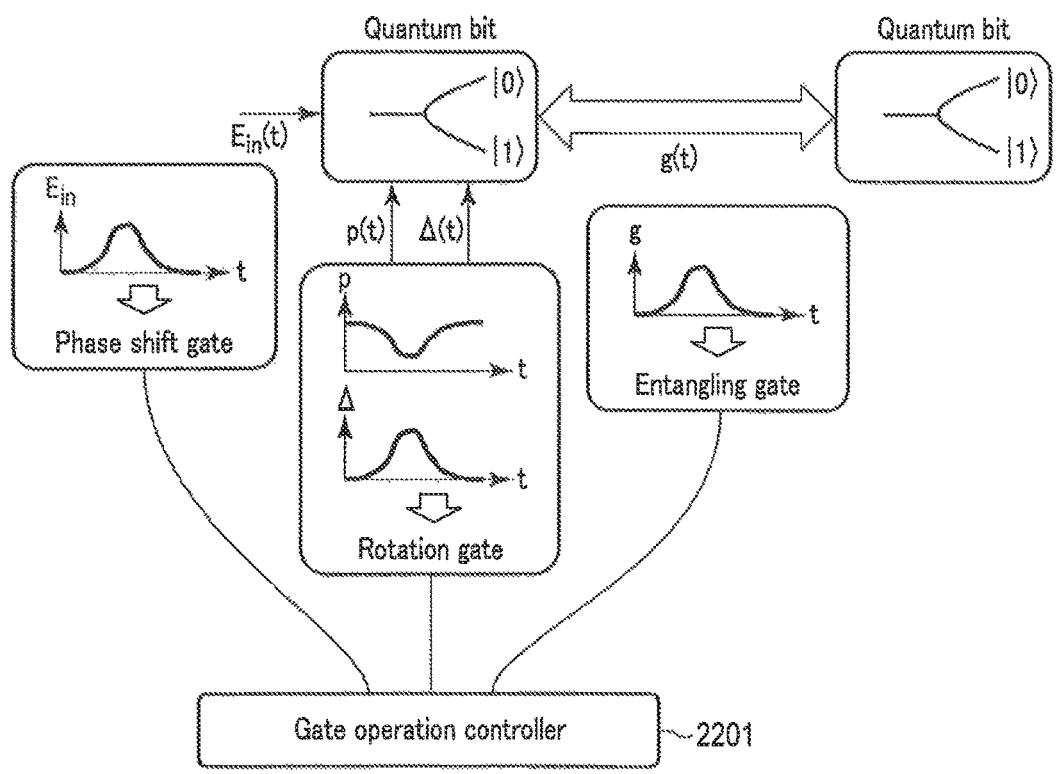
FIG. 22 is a conceptual view of the gate type universal quantum computer using the quantum computation apparatus.

The above processes are summarized in a conceptual view of FIG. 22. A gate operation controller 2201 performs parameter control necessary for the quantum gate operation.

As described above, this quantum computation apparatus using the network of the quantum nonlinear oscillators is not only capable of rapidly solving combinatorial optimization problems, but also capable of executing universal quantum computation based on the quantum gate operation.

EXAMPLES

Examples of the present embodiment will be explained below. Note that a case including three spins will be explained below, but the present embodiment is similarly carried out in other cases. Note also that a Kerr parametric oscillator will be explained as a practical example, but the present embodiment is similarly carried out by using a quantum nonlinear oscillator which shows a quantum-mechanical bifurcation phenomenon.

Example 1

Figure 7:
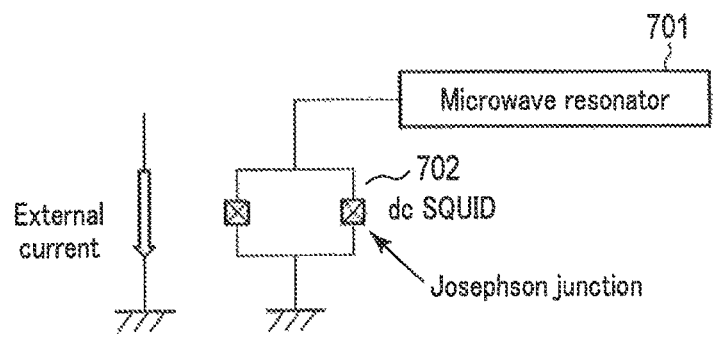
FIG. 7 is a view showing a Kerr parametric oscillator implemented by a superconducting circuit.

First, a Kerr parametric oscillator is implemented by a superconducting circuit shown in FIG. 7 (Z. R. Lin et al., Nat. Commun. 5, 4480 (2014)). This superconducting circuit includes a superconducting microwave resonator 701 and a dc SQUID 702. Note that it is also possible to use the optical Kerr effect and optical parametric amplification, but this example uses a superconducting circuit capable of achieving both a small loss and high nonlinearity.

This circuit has a structure in which the superconducting microwave resonator 701 is terminated by the dc SQUID 702. The controller 103 supplies an external current, and modulates the magnetic flux in the dc SQUID 702 by this external current. This makes it possible to adjust the eigenfrequency (detuning) of the oscillator, and the pump amplitude of parametric amplification. Accordingly, it is possible to adjust detuning for satisfying the initial condition of a quantum adiabatic change, and control the parametric amplification factor for executing the above-described computation principle. The controller 103 executes these processes. In addition, the Kerr effect is obtained by the nonlinearity of the Josephson junction of the dc SQUID 702.

In addition to the abovementioned oscillator, a quantum nonlinear oscillator showing a quantum-mechanical bifurcation phenomenon can be implemented by various methods by a superconducting circuit using the nonlinearity of the Josephson circuit.

Figure 8:
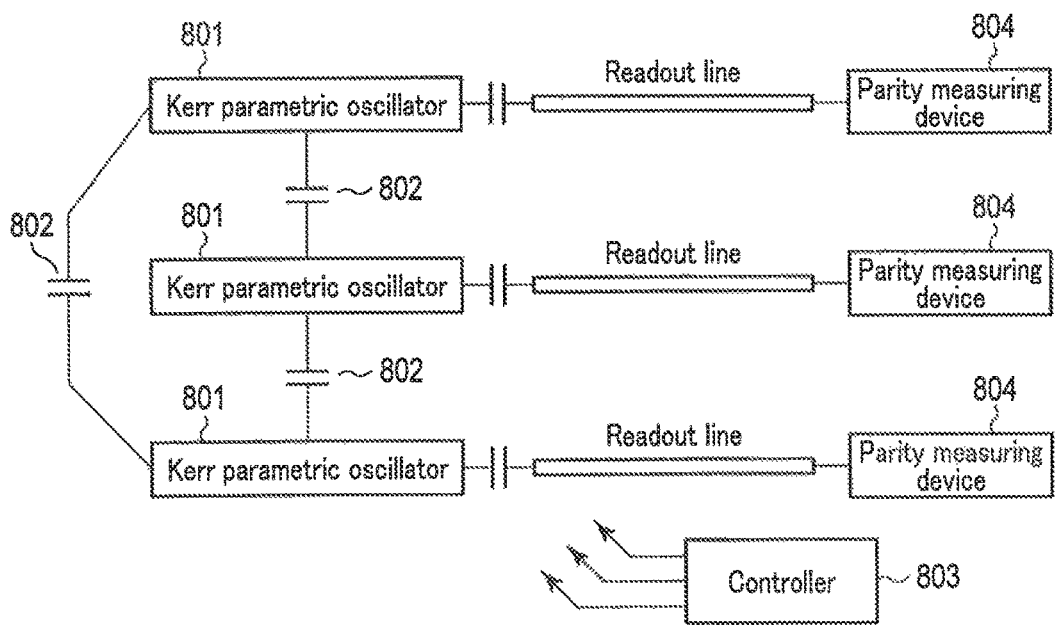
FIG. 8 is a view showing an example of a quantum computation apparatus for three spins.

Nondissipative coupling between the Kerr parametric oscillators is implemented by coupling using a capacitor. FIG. 8 is a conceptual view of a network including three Kerr parametric oscillators 801.

A controller 803 gradually changes a bifurcation parameter from zero so as to exceed the bifurcation point. After that, as shown in FIG. 8, the result is read by coupling a readout line to each Kerr parametric oscillator 801 via a capacitor 802, amplifying an output to the readout line by an amplifier, and measuring the phase by heterodyne detection. The obtained phase is converted into ±1 (parity) in accordance with two 180° ranges determined by a relative phase with respect to the pump. This is the computation result. (Referring to FIG. 8, a parity measuring device 804 performs the above processing.)

Figure 9:
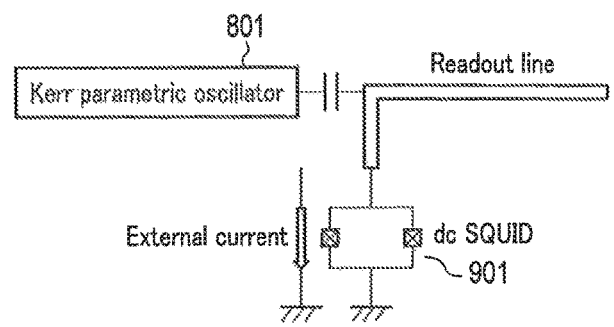
FIG. 9 is a view showing a circuit capable of switching on and off the coupling of a Kerr parametric oscillator and readout line.

Note that the coupling between the Kerr parametric oscillator 801 and readout line is desirably switched off during computation. This can be implemented by terminating the readout line by a dc SQUID 901 as shown in FIG. 9 (M. Wallquis et al., Phys. Rev. B 74, 224506 (2006)).

When processing an Ising model including a local external magnetic field term, a port capable of inputting an electromagnetic wave is formed in each Kerr parametric oscillator, and inputting an electromagnetic wave from this port.

Example 2

Figure 10:
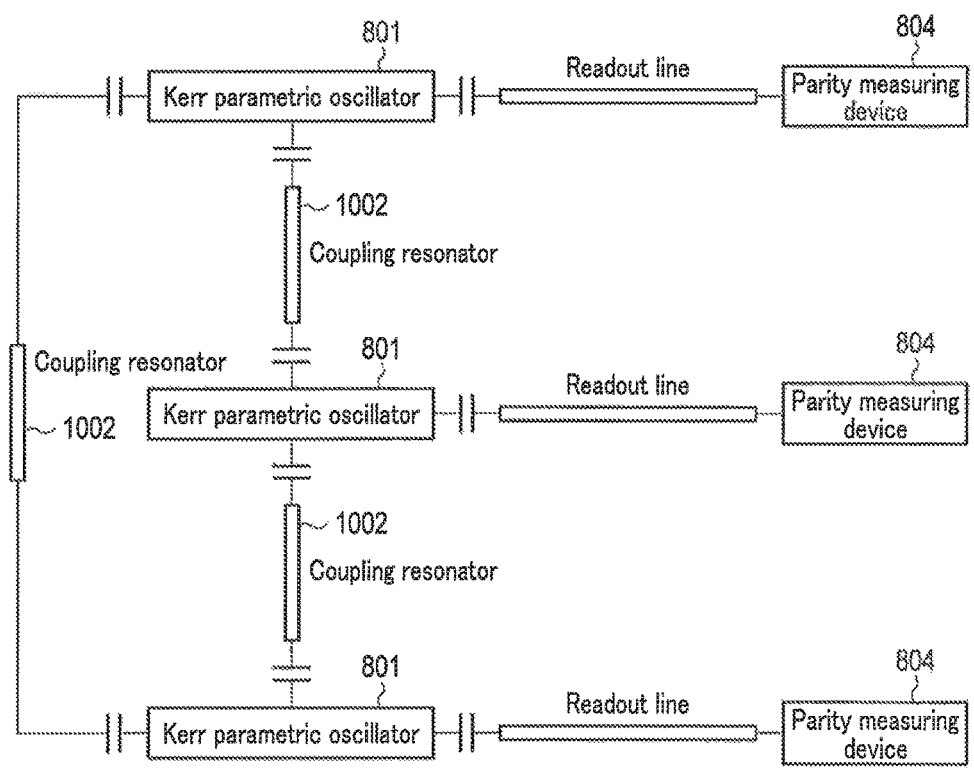
FIG. 10 is a view showing an example of a quantum computation apparatus implementing nondissipative coupling by using a coupling resonator.

In (Example 1), the nondissipative coupling is implemented by directly coupling the Kerr parametric oscillators 801 via the capacitor 802. In this direct coupling, however, the degree of freedom of the oscillator layout is small, and the coupling constant is difficult to change. In this example, therefore, Kerr parametric oscillators 801 are coupled by a coupling resonator 1002 (FIG. 10). This increases the degree of freedom of the layout, and facilitates changing the coupling constant in accordance with a problem to be solved by parameter adjustment of the coupling resonator 1002. The ability to implement desired coupling by the coupling resonator 1002 will be explained first.

Let $b_{i,j}$ be the annihilation operator of a coupling resonator $(i, j)$ for coupling the ith oscillator and jth oscillator $(i<j)$, $\omega_{i,j}$ be the eigenfrequency of the resonator, and $g_{i,j}$ and $g_{j,i}$ be the coupling strengths of the ith oscillator and jth oscillator, respectively. In this case, Hamiltonian corresponding to the coupling resonator is as follows:

$$H_i = \hbar \sum_{i<j} [\Delta_{i,j} b_{i,j}^\dagger b_{i,j} + g_{i,j}(b_{i,j}^\dagger a_i + b_{i,j} a_i^\dagger) + g_{j,i}(b_{i,j}^\dagger a_j + b_{i,j} a_j^\dagger)] \quad (39)$$

where detuning $\Delta_{i,j}$ is defined by $\Delta_{i,j} = \omega_{i,j} - \omega_p/2$. (For convenience, detuning is defined by $\Delta_{j,i} = \omega_{i,j} - \omega_p/2$ for $i>j$ as well.)

When the absolute value of the detuning $\Delta_{i,j}$ is much larger than the absolute values of other parameters (the Kerr constant K, the pump amplitude p of parametric amplification, the detuning $\Delta_i$ of each oscillator, the coupling strength $\xi_0 J_{i,j}$, and the pump amplitude $\xi_0 \alpha$ for the local external magnetic field term), the degree of freedom of the coupling resonator 1002 can adiabatically be erased, and an effective Hamiltonian obtained as a result of this is as follows:

$$H_i' = -\hbar \sum_{i<j} \left[ \frac{(g_{i,j} a_i^\dagger + g_{j,i} a_j^\dagger)(g_{i,j} a_i + g_{j,i} a_j)}{\Delta_{i,j}} \right] = \quad (40)$$

$$-\hbar \sum_{i \neq j} \frac{g_{i,j}^2}{\Delta_{i,j}} a_i^\dagger a_i - \hbar \sum_{i \neq j} \frac{g_{i,j} g_{j,i}}{\Delta_{i,j}} a_i^\dagger a_i.$$

Therefore, the abovementioned desired Hamiltonian can be implemented by selecting $g_{i,j}$ and $\Delta_{i,j}$ so as to satisfy the following equations:

$$\Delta_i = -\sum_{j \neq i} \frac{g_{i,j}^2}{\Delta_{i,j}}, \xi_0 J_{i,j} = \frac{g_{i,j} g_{j,i}}{\Delta_{i,j}}. \quad (41)$$

If all values of $\Delta_{i,j}$ are negative, $H'_I$ is obviously a nonnegative operator from the aforementioned definition, so the positive semidefinite conditions of the matrix M for satisfying the initial conditions of the quantum adiabatic change are automatically satisfied. Note that detuning may also be added to each oscillator within a range in which the positive semidefinite conditions of the matrix M are met.

The degree of freedom of the layout of the quantum nonlinear oscillators 101 can be increased by deforming the coupling resonator 1002. Also, the coupling constant $\{J_{i,j}\}$ can be changed in accordance with a problem to be solved, by adjusting the coupling strength $g_{i,j}$ of the oscillator and coupling resonator, and the detuning $\Delta_{i,j}$ of the coupling resonator.

The coupling strength $g_{i,j}$ of the Kerr parametric oscillator 801 and coupling resonator 1101 and the detuning $\Delta_{i,j}$ of the coupling resonator 1101 can be adjusted by terminating the coupling resonator 1101 by a dc SQUID 1102, in the same manner as that for the abovementioned readout line. FIG. 11 shows the configuration. Consequently, it is possible to adjust not only the absolute values but also the signs of $g_{i,j}$ and $\Delta_{i,j}$. The coupling constant $\{J_{i,j}\}$ can thus be changed in accordance with a problem to be solved.

Example 3

An example which improves the accuracy by controlling detuning will be explained below. In addition to the configuration of (Example 1) or (Example 2), this example includes a solution selector device which sends various detuning settings to a controller (103, 803) for controlling detuning, receives computation results from a measuring device (104, 804), and selects and outputs the most desirable one of computation results obtained for different detuning settings. In this example, a superconducting microwave resonator having a dc SQUID is used as a nonlinear oscillator 101 or 801, so detuning is controlled by controlling the internal magnetic flux of the dc SQUID by an external current.

Figure 17:
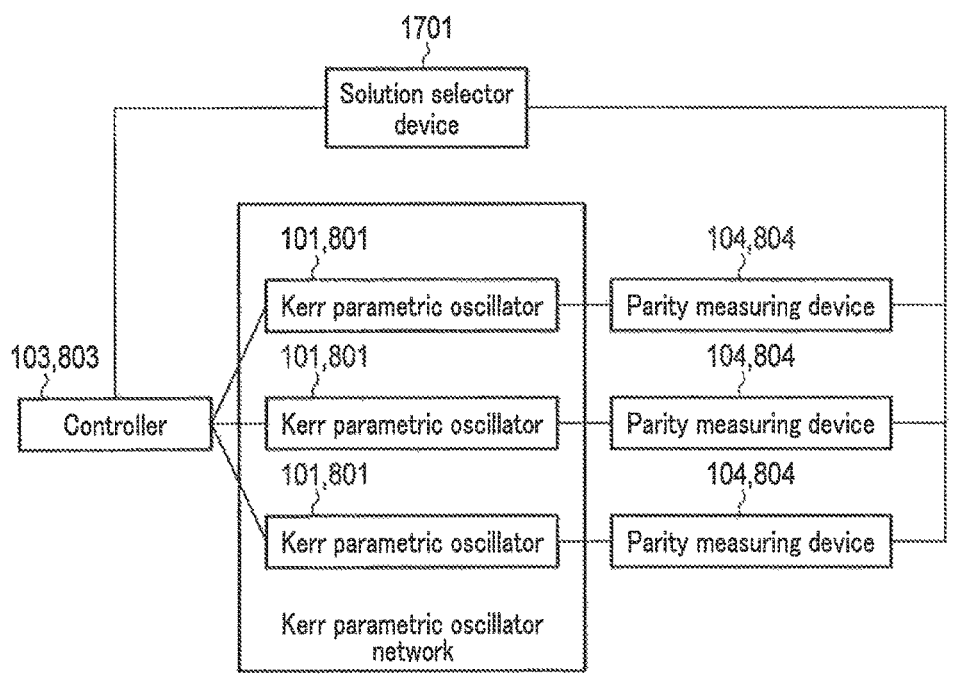
FIG. 17 is a view showing an example of a quantum computation apparatus which improves the accuracy by controlling detuning.

FIG. 17 shows the arrangement of this example. A solution selector device 1701 sends the detuning settings to the controller 103 or 803, and the controller 103 or 803 controls the detuning of each oscillator 101 or 801 in accordance with the received detuning settings. This control includes the following two cases.

1. Detuning has a predetermined value satisfying the initial conditions of a quantum adiabatic change.
2. The initial value satisfies the initial conditions of a quantum adiabatic change, and the value is finally zeroed.

Computation is repeated by variously changing the predetermined value of detuning in case 1, and by changing the initial value of detuning in case 2. The solution selector device 1701 receives the computation results from the parity measuring device 104 or 804, calculates the residual energy corresponding to each computation result, selects one which minimizes the residual energy, and outputs the selected result.

Example 4

Figure 23:
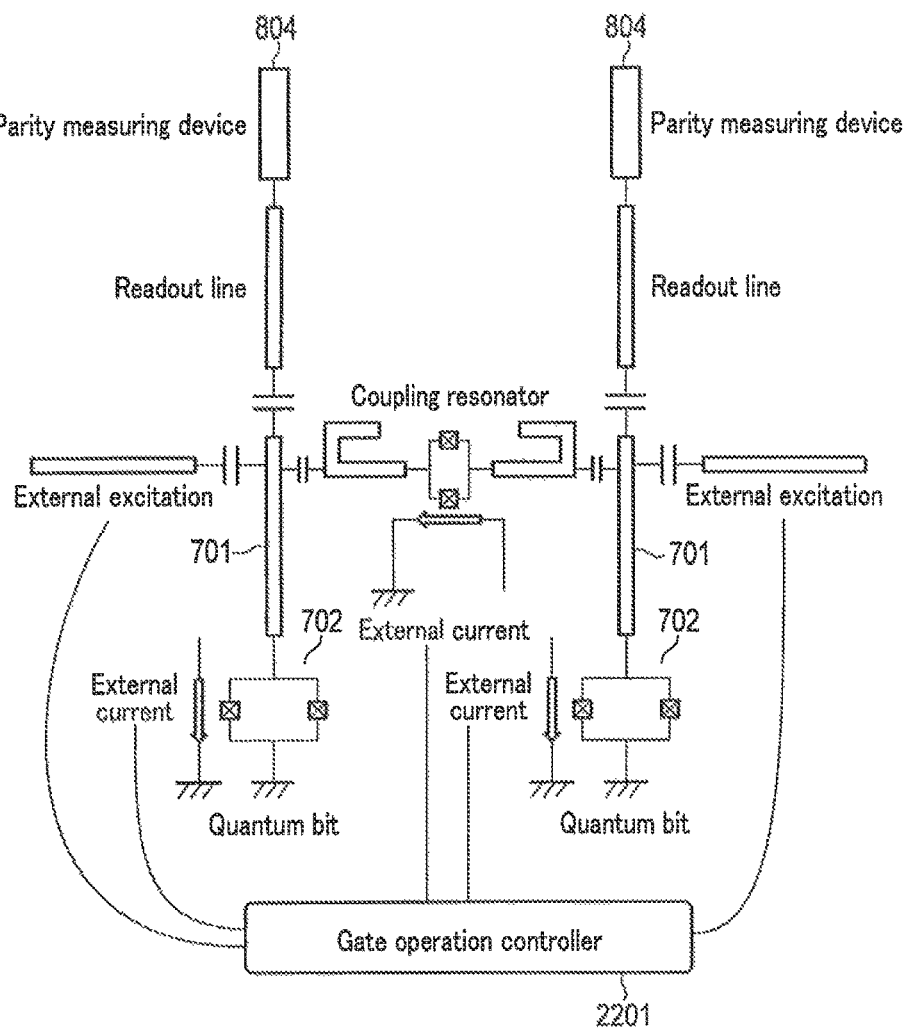
FIG. 23 is a view showing an example of the quantum computation apparatus to be used in the gate type universal quantum computer.

An example of a universal quantum computer based on a quantum gate operation will be explained. FIG. 23 shows the arrangement of this example. FIG. 23 shows only two quantum bits for the sake of simplicity, but the same shall apply to three or more quantum bits. To control the coupling coefficient, inter-oscillator coupling by the coupling resonator of Example 2 is used. The coupling coefficient can be controlled by controlling the magnetic flux in a dc SQUID of the coupling resonator by an external current. (As is apparent from equation (41), extra detuning occurs when the coupling resonator is used, but the influence of this detuning is negligible if it is much smaller than the pump amplitude $p_0$. If the influence is not negligible, it can be eliminated by adjusting the detuning of each of oscillators 701 and 702.)

This example includes a gate operation controller 2201 for executing a quantum gate operation. The gate operation controller 2201 controls an external excitation electromagnetic wave when executing a phase gate shift, controls the pump amplitude and detuning by an external current for controlling the magnetic flux of a dc SQUID 702 of each oscillator when executing a rotation gate, and controls the coupling coefficient between the oscillators by an external current for controlling the magnetic flux of the dc SQUID of the coupling resonator when executing an entangling gate.

In addition to the above description, the embodiments include the following items.

Item 1: A quantum computation apparatus comprising: a plurality of quantum nonlinear oscillators each of which implements superposition of distinguishable quantum states by bifurcating one quantum state via a quantum adiabatic change controlled by a bifurcation parameter; a controller configured to use two bifurcated quantum states generated by the quantum nonlinear oscillator as a quantum bit, execute a phase shift gate by a quantum adiabatic change caused by irradiating the quantum nonlinear oscillator with an external excitation pulse, execute a rotation gate by a quantum adiabatic change caused by changing, like a pulse, detuning of an eigenfrequency of the quantum nonlinear oscillator with respect to parametric excitation, and execute an entangling gate by a quantum adiabatic change caused by changing a coupling coefficient between the quantum nonlinear oscillators like a pulse; and a measuring device configured to measure outputs from the quantum nonlinear oscillators, and read out the quantum bits.

Item 2: The apparatus according to Item 1, wherein the controller initially sets the quantum nonlinear oscillator in a vacuum state, and prepares an initial state of a quantum bit by a quantum adiabatic change caused by changing detuning with respect to parametric excitation from a finite value to zero and changing a value of the bifurcation parameter from zero to not less than a bifurcation point.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A quantum computation apparatus comprising:
a plurality of quantum nonlinear oscillators each of which implements superposition of distinguishable quantum states by bifurcating one quantum state via a quantum adiabatic change controlled by a bifurcation parameter, and which couple with each other by nondissipative coupling;
a controller configured to individually control the bifurcation parameters of the quantum nonlinear oscillators; and
a measuring device configured to measure outputs from the quantum nonlinear oscillators.

2. The apparatus according to claim 1, further comprising a plurality of couplers configured to connect the quantum nonlinear oscillators, and implement the nondissipative coupling.

3. The apparatus according to claim 1, wherein the controller further controls eigenfrequencies of the quantum nonlinear oscillators such that an eigenstate corresponding to a minimum or maximum eigenvalue of Hamiltonian which defines time evolution of a system at an initial stage of computation is a vacuum state.

4. The apparatus according to claim 1, wherein the measuring device includes a parity measuring device configured to measure whether the output from the quantum nonlinear oscillators are positive or negative.

5. The apparatus according to claim 1, wherein the quantum nonlinear oscillators are Kerr parametric oscillators having parametric amplification and a Kerr effect.

6. The apparatus according to claim 5, wherein the Kerr parametric oscillators are implemented by a superconducting circuit having a Josephson junction.

7. The apparatus according to claim 1, wherein the quantum nonlinear oscillators are implemented by a superconducting circuit having a Josephson junction.

8. The apparatus according to claim 1, wherein the nondissipative coupling is coupling via a capacitor.

9. The apparatus according to claim 1, wherein the nondissipative coupling is implemented by using a coupling resonator having a resonance frequency detuned from an eigenfrequency of the quantum nonlinear oscillators.

10. A quantum computation method comprising:
coupling a plurality of quantum nonlinear oscillators with each other, each of which implements superposition of distinguishable quantum states by bifurcating one quantum state via a quantum adiabatic change controlled by a bifurcation parameter, by nondissipative coupling;
controlling the bifurcation parameters of the quantum nonlinear oscillators; and
measuring outputs from the quantum nonlinear oscillators.

11. The method according to claim 10, further comprising setting eigenfrequencies of the quantum nonlinear oscillators such that an eigenstate corresponding to a minimum or maximum eigenvalue of Hamiltonian which defines time evolution of a system at an initial stage of computation is a vacuum state.

12. The apparatus according to claim 1, further comprising:
a detuning controller configured to set initial values of eigenfrequencies of the quantum nonlinear oscillators, and control the eigenfrequencies after an initial stage; and
a solution selector device configured to cause the detuning controller to repeat a process of performing computation by controlling the eigenfrequencies to different settings within a range which satisfies an initial condition that an eigenstate corresponding to a minimum or maximum eigenvalue of Hamiltonian which defines time evolution of a system at the initial stage of computation is a vacuum state, and select and output a most desirable one of computation results.

13. The apparatus according to claim 12, wherein the detuning controller selects different initial values in the different settings, and sets a constant value thereafter.

14. The apparatus according to claim 12, wherein the detuning controller performs control such that initial values of the eigenfrequencies satisfy the initial condition, and detuning with respect to parametric excitation is zero at the end of computation.

15. The method according to claim 10, further comprising repeating a process of performing computation by controlling eigenfrequencies of the quantum nonlinear oscillators to different settings within a range which satisfies an initial condition that an eigenstate corresponding to a minimum or maximum eigenvalue of Hamiltonian which defines time evolution of a system at an initial stage of computation is a vacuum state, and selecting and outputting a most desirable one of computation results.

16. The method according to claim 15, further comprising selecting different initial values in the different settings, and setting a constant value thereafter.

17. The method according to claim 15, wherein the different settings include a case in which an initial value is set to satisfy the initial condition, and changed such that detuning with respect to parametric excitation is zero at the end of computation.

18. The apparatus according to claim 1, further comprising a gate operation controller configured to use two bifurcated quantum states of the quantum nonlinear oscillators as a quantum bit, and execute:
- control of a bifurcation parameter for preparing for an initial state of the quantum bit by a quantum adiabatic change;
- control of external excitation to the quantum nonlinear oscillators for executing a phase shift gate by the quantum adiabatic change;
- control of detuning or pump amplitude of the quantum nonlinear oscillators for executing a rotation gate by the quantum adiabatic change; and
- control of a coupling coefficient between the quantum nonlinear oscillators for executing an entangling gate by the quantum adiabatic change.

19. A quantum computation method comprising:
using a plurality of quantum nonlinear oscillators each of which implements superposition of distinguishable quantum states by bifurcating one quantum state via a quantum adiabatic change controlled by a bifurcation parameter;
using two bifurcated quantum states of the quantum nonlinear oscillators as a quantum bit;
executing a phase shift gate by a quantum adiabatic change caused by irradiating the quantum nonlinear oscillators with an external excitation pulse;
executing a rotation gate by a quantum adiabatic change caused by changing, like a pulse, detuning of an eigenfrequency of the quantum nonlinear oscillators with respect to parametric excitation; and
executing an entangling gate by a quantum adiabatic change caused by changing a coupling coefficient between the quantum nonlinear oscillators like a pulse.

20. The method according to claim 19, further comprising initially setting the quantum nonlinear oscillators in a vacuum state, and preparing an initial state of a quantum bit by a quantum adiabatic change of changing detuning with respect to parametric excitation from a finite value to zero and changing a value of the bifurcation parameter from zero to not less than a bifurcation point.

* * * * *